United States Patent [19]
McConnell

[11] 4,085,373
[45] Apr. 18, 1978

[54] FREQUENCY-TO-VOLTAGE TRANSDUCER FOR SPEED GOVERNOR SYSTEMS OR THE LIKE

[75] Inventor: Robert G. McConnell, Fort Collins, Colo.

[73] Assignee: Woodward Governor Company, Rockford, Ill.

[21] Appl. No.: 738,354

[22] Filed: Nov. 3, 1976

[51] Int. Cl.² ............................................. H03K 9/06
[52] U.S. Cl. ...................................... 328/141; 328/48; 328/129; 180/105 E; 307/233 A
[58] Field of Search ................. 328/48, 129, 140, 141; 307/233 A; 180/105 E; 235/150.2

[56] References Cited

U.S. PATENT DOCUMENTS

| | | | |
|---|---|---|---|
| 3,050,708 | 8/1962 | Van Alstyne et al. | 328/129 X |
| 3,226,568 | 12/1965 | Samwel | 328/129 X |
| 3,564,426 | 2/1971 | Anderson et al. | 328/48 |
| 3,944,935 | 3/1976 | Plant | 328/141 X |
| 4,025,868 | 5/1977 | Miki et al. | 328/141 |

Primary Examiner—John S. Heyman
Attorney, Agent, or Firm—Leydig, Voit, Osann, Mayer & Holt, Ltd.

[57] ABSTRACT

A speed governing system utilizing a magnetic pickup for sensing speed with a frequency-to-voltage transducer of the type in which each input signal initiates a counting cycle by a digital counter receiving relatively high, constant frequency input pulses to measure off a predetermined time interval, and characterized in that the output signal from the counter itself forms a variable duty cycle squarewave signal whose dc. or average value varies according to changes in the input signal frequency. The counter output signal also controls termination of each counting cycle. The transducer may include means for converting the transducer output signal to a failsafe level in the event that sensed speed and the input signal frequency become so great that there is an erroneous attempt for the system to stabilize at twice the set point speed.

10 Claims, 6 Drawing Figures

FREQUENCY-TO-VOLTAGE TRANSDUCER FOR SPEED GOVERNOR SYSTEMS OR THE LIKE

BRIEF SUMMARY OF THE INVENTION

The present invention relates in general to frequency-to-voltage transducers for producing an output signal which varies according to changes in the frequency of an input signal. More particularly, the invention relates to transducers, usable in governor systems for prime movers, to create a dc. voltage which varies as and represents the actual speed of the controlled prime mover. In such systems the speed of the controlled primer mover is sensed by a pickup which produces recurring input signals with a frequency that varies in proportion to changes of actual speed. That frequency is converted into a correspondingly variable dc. voltage output which is compared with a set point voltage to produce a variable throttle position command voltage applied to a throttle actuator to correctively adjust the rate of fuel input to the prime mover.

It is the general aim of the invention to provide a frequency-to-voltage transducer which not only is digital in its basic nature, and thereby avoids inaccuracies due to temperature or aging changes in electronic circuit components, but is also extremely simple in its organization and reliable in its operation.

A related object of the invention is to create a frequency-to-voltage transducer of the type in which a counter responds to pulses from a precision frequency source during successive counting cycles, each initiated by an input signal, and characterized by the fact that the counter itself directly produces a squarewave output voltage of variable dc. content, the latter voltage also being utilized to control a gate which initiates and terminates the counting action.

Another object is to provide such a transducer in which erroneous operation is precluded in the event that the input signals should, for any reason, recur with a period less than the time duration of each counting cycle. In this respect, it is an object to prevent the governor system for a prime mover from attempting to stabilize the control speed at a value which is twice the set point speed.

Still another object is to convert the final, variable duty cycle voltage of such a transducer to a particular one of two possible levels in the event that an input signal appears while a counting cycle, initiated by the previous input signal, is in progress.

These and other objects and advantages will become apparent as the following description proceeds with reference to the accompanying drawings.

While the invention has been shown and will be described in some detail with reference to preferred, exemplary embodiments, there is no intention that it thus be limited to such detail. On the contrary, it is intended here to cover all modifications, alternatives and equivalents which fall within the spirit and scope of the appended claims.

DETAILED DESCRIPTION

By way of brief introduction, a prime mover 10 (FIG. 1) such as a diesel engine is mechanically coupled to its driven load 11 and has an associated throttle 10a and an electromagnetic throttle actuator 12. The position of the throttle is determined by the voltage or current excitation applied to the actuator and controls the rate of energy medium or fuel input to the prime mover. As the throttle 10a is opened or closed in response to increases or decreases in a position command voltage supplied over a conductor 14, the prime mover 10 tends to increase or decrease in its operating speed. On the other hand, as the torque exerted by the load 11 increases or decreases, the speed of the prime mover 10 tends to decrease or increase if the throttle position and rate of fuel input remain the same.

Figure 1:
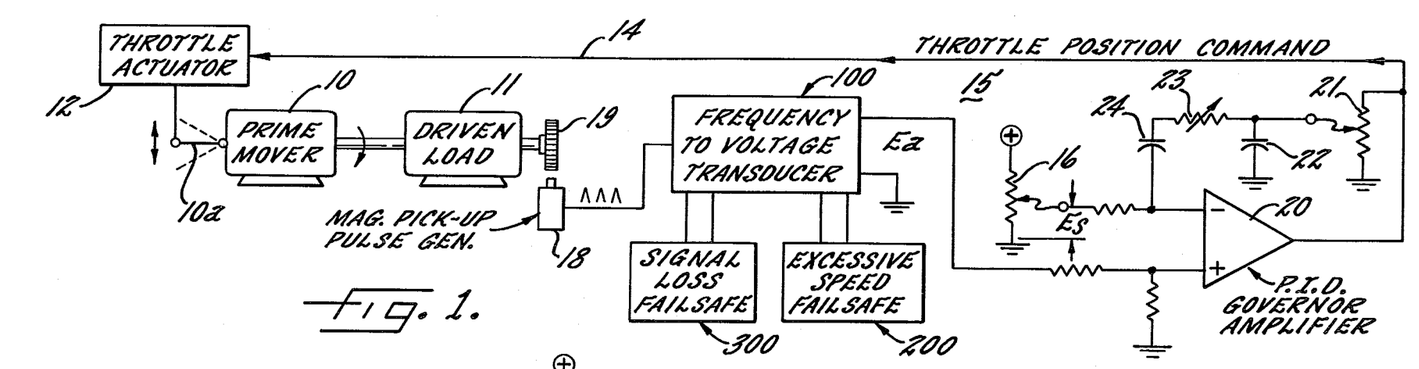
FIG. 1 is a generalized diagrammatic illustration of a speed governing system employing the improved frequency-to-voltage transducer of the present invention.

It is the purpose of the speed governing system 15 to maintain the speed of the prime mover 10 and driven load 11 substantially constant at a selected value represented by a set point signal $E_s$ derived from any suitable source such as an adjustable potentiometer 16. When the torque of the load 11 increases or decreases and actual speed tends to decrease or increase, the governor system will readjust the throttle 10a to restore the speed to the set point value represented by the signal $E_s$. On the other hand, if the potentiometer 16 is adjusted to increase or decrease the set point signal $E_s$, the governor system will cause the throttle 10a to open or close until the speed is increased or decreased to agree with the new set point value.

In general terms, the governor system 15 includes means for producing an actual speed signal $E_a$ in the form of a dc. voltage which varies in accordance with changes in sensed speed. For this purpose, a magnetic pickup pulse generator 18 is disposed in cooperative spaced relation to a gear or toothed wheel 19 driven directly by, or in timed relation to, the rotating prime mover shaft. As each tooth passes the pickup 18, one signal or pulse is created and fed as an input to a frequency-to-voltage transducer 100. The latter creates the actual speed signal $E_a$ which varies in magnitude inversely according to changes in the frequency of its input signals and thus according to changes in sensed speed.

The set point signal $E_s$ and the actual speed signal $E_a$ are compared in a governor amplifier having proportional, integral, derivative (PID) response characteristics. As here shown, the set point voltage $E_s$ is applied to the inverting input terminal, and the actual speed voltage $E_a$ is applied to the non-inverting terminal, of an operational amplifier 20 through appropriate input resistors. The output of the operational amplifier is coupled back to the inverting input through a potentiometer 21 working into a shunt capacitor 22, a rheostat 23 and a series capacitor 24. The potentiometer 21 creates a proportional term, the capacitor 22 creates a derivative term, and the capacitor 24 creates an integral term in the overall transfer function of the amplifier 20 — as is well known, Proportional gain is adjusted by setting the potentiometer 21 while the gain for derivative action is generally adjusted by setting the rheostat 23. The output of the amplifier 20 thus forms a throttle position command voltage which is applied (through an additional amplifier if necessary) to the throttle actuator 12. Whenever the speed of the prime mover 10 is below the set point and the voltage $E_a$ is greater than the voltage $E_s$, the throttle position command voltage becomes more positive and the actuator 12 shifts the throttle 10a in an opening direction. Conversely, when the speed of the prime mover is above the set point and the voltage $E_s$ is greater than the voltage $E_a$, the throttle position command signal decreases so that the actuator 12 shifts the throttle 10a in a closing direction.

Figure 2:
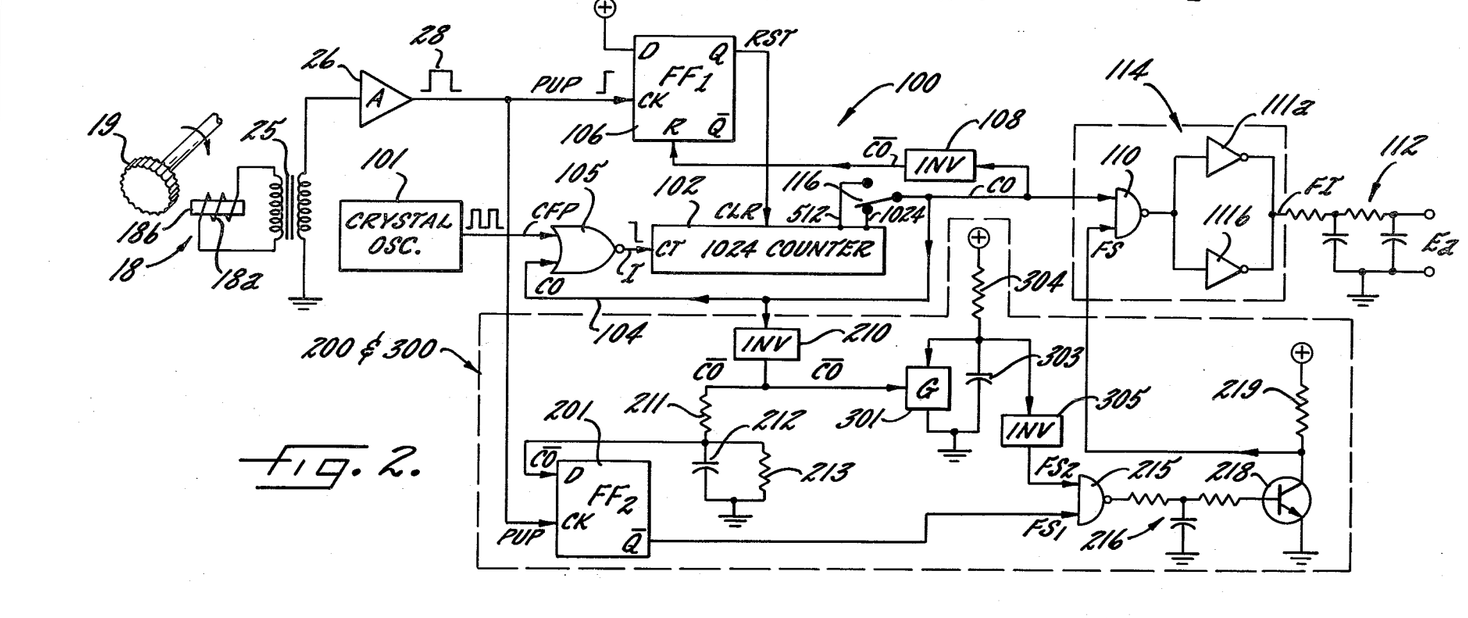
FIG. 2 is a schematic block-and-line diagram showing the details of a transducer which embodies the features of the present invention.

The present invention is concerned with the frequency-to-voltage transducer 100 and the improvements which it imparts to the overall governing system. The details of that transducer are illustrated in FIG. 2 which also shows, for completeness, the toothed gear or wheel 19 associated with the magnetic pickup 18. The latter is illustrated as constituted by a coil 18a disposed on a magnetically permeable core 18b closely spaced from the teeth of the wheel 19. As each tooth passes the core 18b, changes in magnetic flux linking in the coil 18b, induce one cycle of an alternating signal, i.e., a small positive pulse followed by a small negative pulse. The output of the pickup is preferably applied through a transformer 25 to a pulse shaping amplifier 26 (which acts also as a unidirectional diode) whose output thus becomes a positive squarewave pulse 28 corresponding to each passage of a tooth past the pickup 18. The pickup pulses 28, here designated PUP, form the input to the transducer 100 and, as noted above, they vary directly in frequency or recurrence rate according to changes in the sensed speed of the prime mover 10.

In its general aspects, the transducer comprises a digital counter which is initiated by each input pulse to undergo a cycle of counting a certain number of pulses from a precision constant frequency pulse source. As here shown, that source of constant frequency pulses CFP is a crystal oscillator 101 which operates continuously at a frequency substantially higher than the maximum expected frequency of the recurring input signals PUP. "Substantially higher" as that term is here used means higher by two to seven or eight orders of magnitude. As an example for purposes of discussion, the constant frequency of the pulses CFP from oscillator 101 may be about 1.6 MHz. while the maximum frequency of the input signals may be on the order of 200 Hz.

The digital counter 102 is of known, conventional organization. It may be made up of a tandem array of bi-state flip-flops arranged to count in a standard binary or binary coded decimal fashion. In any event it has an output terminal which resides at one of first and second voltage levels only when the counter reaches or exceeds a predetermined count state $CS_1$. As an example, it may be assumed that the counter 102 is made up of eleven flip-flops (not shown) in tandem, so that it may reside in any of 2048 count states (including zero). But the "Q" output terminal of the last flip-flop stage will reside at a "0" logic level (e.g., zero volts) at all times except when the count state is 1024 or greater; conversely, the Q terminal of the last counter stage will reside at the "1" logic level (e.g., +10 volts) when the count state is 1024 or greater. That output terminal is here labeled 1024 and the dc. voltage appearing thereon (which may be either a relatively high or low dc. voltage level) is designated as the counter output signal CO. The counter registers one count in response to each negative-going transition at its input terminal CT, and it includes conventional means for presetting to a preselected count state $CS_o$ (lower than the predetermined count state $CS_1$) in response to a high, logic 1 voltage (e.g., +10 volts) applied to its "clearing" terminal CLR. In the present instance, the preselected count state $CS_o$ is zero, but other presetting values may be employed.

The pulses CFP are controlled as to their entry into the counter 102 by a signal which is derived from or constituted directly by the counter output CO. In the preferred embodiment, the signal CO is fed back over a conductor 104 to control a suitable gate, here shown as a NOR gate 105 which receives the pulses CFP at its second input. Thus, so long as the counter is in count state 1024 and the output signal CO is at a logic 1 level, the input terminal CT is held at a low or 0 logic level. But when the counter is not in count state 1024 and the output signal CO is at the 0 logic level, the pulses CFP pass with inversion through the NOR gate 105 to the terminal CT. Manifestly, the counter 102 will "normally" reside in the 1024 count state with the NOR gate 104 disabled by the counter output voltage CO.

In carrying out the invention, means are provided to initiate a counting cycle by presetting the counter 102 to the lower, preselected count state $CS_o$ in reponse to the arrival of each input signal PUP. For this purpose, a bi-state device is arranged to be set by each input signal and the setting of the bi-state device in turn presets or clears the counter 102. The resulting transition in the counter output signal CO is caused to reset the bi-state device. In the specific example of FIG. 2, a D-type flip-flop 106 receives the input signals PUP on its "clock" terminal CK, while its control terminal D is tied permanently to a logic 1 level voltage, here represented by the symbol $\mp$. The Q output terminal of the flip-flop 106 produces a signal RST at a logic 1 level only when the flip-flop is set, and this signal RST is fed to the "clearing" terminal CLR of the counter. To reset the flip-flop 106 very shortly after each setting thereof, the counter signal CO is fed back through an inverter 108 to the overriding reset terminal R of the flip-flop 106. It may be seen, therefore, that in response to the positivegoing wavefront of each input signal PUP, the flip-flop 106 is "clocked" to a set state; the signal RST switches from a logic 0 to a logic 1 level; and the counter 102 is preset to a preselected count state which, in the present instance, is the cleared or zero count state. Such clearing of the counter causes its output signal CO to switch from a high to a low logic level so that the output $\overline{CO}$ of the inverter swings from a low to a high logic level, thereby immediately resetting the flip-flop 106 after, but only after, the counter has been cleared.

In a fashion to be explained more fully below, the counter output signal CO has the form of a squarewave with a duty cycle that varies according to the changes in the frequency of the input pulses PUP. The output signal CO is coupled as one input to a NAND gate 110 which may be considered for the moment as permanently enabled by a 1 logic level for the control signal FS applied to its other input. The output of the NAND gate 110 is fed to two or more paralleled inverting amplifiers 111a and 111b which in turn produce an input signal FI to an averaging filter 112. The transducer output signal $E_a$, which is a dc. voltage varying inversely as the frequency of the input signals PUP changes, appears at the output of that filter.

Assuming that the NAND gate 110 is enabled by the signal FS residing at a 1 logic level, that gate passes the signal CO in inverted form. The ampifiers 111a and 111b are employed to present a low output impedance working into the low impedance of the filter 112 and they introduce a second inversion. Since there is a double inversion, the gate 110 and the amplifiers 111 in effect collectively constitute a single AND gate 114 which is enabled by the signal FS and transmits the signal CO to create an amplified counterpart FI which is the input signal for the filter 112. Because the duty cycle of the signals CO and FI may vary, their average dc. values correspondingly vary, and the filter 112 creates smoothing action to make the signal $E_a$, by its positive magnitude, vary inversely according to changes in the frequency of the input signals PUP.

Figure 3:
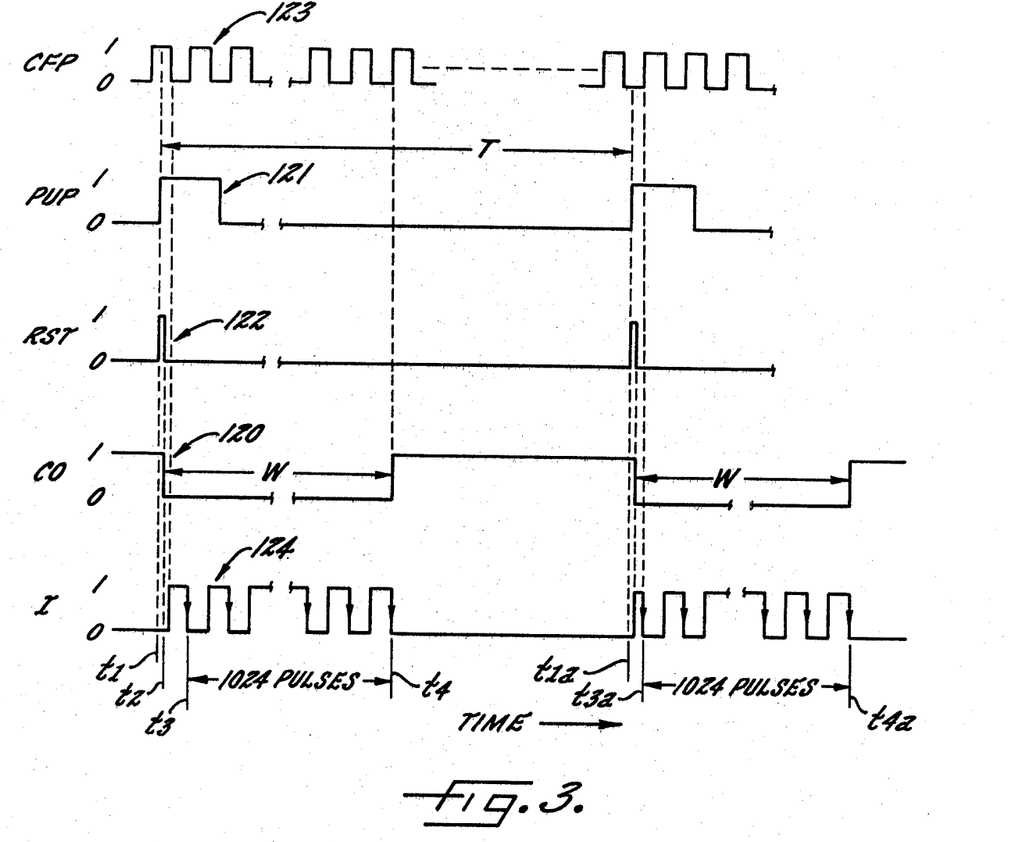
FIG. 3 is a series of waveforms, plotted against time, to indicate how certain signals in the transducer of FIG. 2 vary with time.

The operation of the transducer 100 may now be better understood with reference to FIG. 3 taken in conjunction with FIG. 2. Assuming that the counter 102 is initially in the 1024 count state and the signal CO (waveform 120) is thus at a 1 logic level, NOR gate 105 is initially disabled so that the counter is not counting. When the next signal PUP (waveform 121) arrives at instant $t_1$ (FIG. 3), the flip-flop 106 is set and the signal RST (waveform 122) swings from a 0 to a 1 level. This clears the counter 102 to a zero count state, but a small propagation delay may be required for this clearing action. FIG. 3 therefore shows the signal CO changing from a 1 to a 0 level at a slightly later instant $t_2$. Such change in the signal CO produces two results. First, the inverter 108 makes the signal $\overline{CO}$ swing to a 1 level so that the flip-flop 106 is cleared or reset and the signal RST restores to a zero level. Secondly, at the instant $t_2$ the signal CO enables the NOR gate 105 so that the pulses CFP (waveform 123) thereafter pass in inverted form to create input pulses I (waveform 124) at the terminal CT. Thus, the counter begins a counting cycle, counting upwardly from zero, with the first count being registered on the negative-going transition of the signal I at instant $t_3$.

As indicated by the wavy time-break lines in FIG. 3, the counter registers 1024 pulses until the last of such pulses causes the signal CO to swing from the zero to the one logic level at instant $t_4$. The time width W or duration of the "low state" in the signal CO is thus equal to the interval between instants $t_3$ and $t_4$ plus the essentially negligible short interval between instants $t_1$ and $t_3$. Assuming merely for the sake of discussion that the oscillator 101 produces the pulses CFP at a frequency of 1.6 MHz., the $t_3$ to $t_4$ interval is $1023 \div 1.6 \times 10^6$ or 0.64 milliseconds. Also assuming the interval between instants $t_1$ and $t_3$ to be equal to one period of the CFP signal, that interval is only 0.625 $\mu$s. The duration W may thus be considered as essentially equal to 0.64 ms. and essentially the same for every counting cycle despite the slight variations which may arise because of the extremely short intervals $t_1$ to $t_2$ and $t_2$ to $t_3$.

FIG. 3 illustrates the arrival of a second input signal PUP at an instant $t_{1a}$, and a "low level" of the counter output signal CO for the same time duration W required to register 1024 counts in the counter. Because in this case the leading edge of the signal PUP is shown approximately midway through a low half cycle of the signal CFP (as contrasted to the instant $t_1$ which occurs midway through a high half cycle of the signal CFP), the time between instants $t_{1a}$ and $t_{3a}$ is even shorter than the time between instants $t_1$ and $t_3$. In any event, the period W is essentially equal in both cases, the later one shown in FIG. 3 terminating at instant $t_{4a}$ after the counter has received 1024 pulses for one counting cycle and the signal CO reverts from the 0 to the 1 logic level.

Of course, the frequency of the pulses PUP may change as the speed of the prime mover and toothed wheel 19 (FIGS. 1 and 2) change. If the period T (which is the reciprocal of the incoming signal frequency) between successive input signals PUP is as shown in FIG. 3, and if it is assumed to be 0.128 ms. (with the intervals W assumed to be 0.64 ms.), then the recurring squarewave signal CO as it appears in FIG. 3 has a duty cycle expressible as:

$$\text{Duty Cycle} = \frac{T - W}{T} \times X100 = .128 - \frac{.64}{.128} \times 100 = 50\%$$

As the frequency of the incoming signals PUP increases or decreases (and the period T of the PUP signals decreases or increases) the duty cycle of the waveform CO will respectively decrease or increase because the intervals W will remain the same in duration. As a specific example using the numbers stated above, if the frequency of the PUP signals varies over a range of 500 Hz. to 1562.5 Hz. (and the period T varies from 20 to 0.64 ms.) the duty cycle of the CO waveform will vary from about 97% to zero percent.

Recalling that the filter input signal FI has exactly the same waveform as the output signal CO, and if it is assumed that the "high" or logic one level of the signal FI is ten volts, then the average dc. value of the signal FI will vary from 9.7 volts to 0 volts over that incoming fequency range. The filter 112 performs an averaging or smoothing function and thus the transducer output signal $E_a$ will be a positive dc. voltage which by its magnitude varies inversely with changes in the frequency of the input signals PUP. In the present example, it will be seen that the final output dc. voltage $E_a$ will vary from about 9.7 volts to zero volts as the incoming frequency increases over a range of about 3 to 1, from 500 Hz. to about 1562 Hz.

Referring back to FIG. 1, consider first that the governor system is operating under steady state equilibrium conditions with the positive voltage $E_a$ equal to the set point voltage $E_s$, the output of the amplifier 20 having stabilized at a particular value that excites the actuator 12 sufficiently to hold the throttle 10a in a position to make the actual speed of the prime mover 10 equal to the set point value. If now the torque imposed by the load 11 should increase and the speed of the prime mover tend to decrease, the signal $E_a$ will increase because it varies in inverse proportion to the sensed actual speed. The output of the amplifier 20 will therefore increase in a positive sense to supply greater excitation to the actuator 12 so that the throttle 10a is shifted in an opening direction to increase the rate of fuel input sufficiently to restore the operating speed to the set point value. As this occurs, the signal $E_a$ will decrease again but the integrating action of the amplifier 20 will stabilize the throttle position command signal at that value necessary to hold the set point speed. On the other hand, if the torque imposed by the load 11 should decrease and the speed of the prime mover therefore tend to increase, the transducer output voltage $E_a$ will decrease and the output of amplifier 20 will change in a decreasing direction to reduce the excitation of the actuator 12. The throttle 10a will thus be shifted in a closing direction to reduce the speed of the prime mover 10 until it reaches the original set point value. This will again increase the actual speed signal $E_a$ but the output of the integrating amplifier 20 will stabilize at a value necessary to hold the throttle 10a in a position to maintain the set point speed.

The transducer 100 shown in FIG. 2 may be easily adjusted to accommodate other ranges of input frequencies. For this purpose, the counter output terminal may be chosen such that 512 pulses are registered during each counting cycle. As here shown, a simple switch 116 may be used to take the output signal CO from the "512" terminal of the tenth flip-flop in the counter 102. Thus, the duration of the equal periods W for each counting cycle would be halved by moving the switch 116 to the position opposite that illustrated in FIG. 2. This would be done if the range of speeds for the particular prime mover being controlled were substantially lower than those which would be properly accommodated when the switch is in the illustrated position. Alternatively, of course, the frequency of the oscillator 101 may be changed to a value other than 1.6 MHz discussed above by way of example. This, too, would result in increasing or decreasing the durations W of the successive counting cycles during which the output signal CO resides at a low level.

With the foregoing in mind, it will be seen that one key to the simplicity and reliability of the transducer 100 lies in the provision of means to initiate a counting cycle by resetting the counter in response to the arrival of an input signal at an instant when the counter is not counting. The flip-flop 106 responds to the leading edge of the pulses PUP to produce the signal RST which clears the counter and thereby causes the signal CO to change from a high to a low level. By this arrangement, the counter itself measures off a counting cycle duration W because the signal CO enables the gate 105 when it reverts to a low level and subsequently disables the gate 105 after precisely 1024 of the pulses CFP have been counted. In consequence, the period T of the waveform CO is variable but always essentially the same as the variable period of the input signals PUP. But since the counting intervals W are essentially all the same in duration, the duty cycle of the bi-level signals CO and FI will vary inversely with changes in the input signal frequency and the filtered final output signal $E_a$ will vary inversely with changes in that frequency.

As noted above, the interval W depends upon two things, viz., the frequency of the pulses CFP and the number of counts which must be registered during each counting cycle. The number of counts so required is determined by the difference between the predetermined count state $CS_1$ and the preselected count state $CS_o$, the former being that count state at which the selected counter output terminal resides at a particular one of its two possible voltage levels (here, the 1 level), and the latter being the count state (here, zero) which the signal RST causes to be preset into the counter. Thus, it should be understood that it is not necessary in the practice of the invention to cause the counter to be cleared by the signal RST when an input signal PUP arrives; alternatively the counter could be preset to any selected count state $CS_o$ which is lower than the predetermined count state $CS_1$, and the number of counts required for a counting cycle would therefore be $CS_1 - CS_o$. For example, if the signal RST were caused to preset the counter to a count state of 124, then 900 pulses CFP would be registered during each counting cycle and the intervals W would be somewhat shorter than described in the examples given above.

The counter 102 is initiated into a counting cycle by each input signal PUP which arrives when the counter is not counting (and the signals CO and $\overline{CO}$ are respectively at 1 and 0 levels). This gives rise to a potential difficulty in the event that, for any reason, the speed of the prime mover 10 (FIG. 1) should increase to such an extent that the pickup pulses PUP rise in frequency sufficiently to make their time spacing or period T less than the chosen duration W of the counting cycles. If that should occur, then the final output signal $E_a$ would actually increase and the governor amplifier 20 would act in a sense tending to open the throttle 10a rather than to close it as required.

Figure 6:
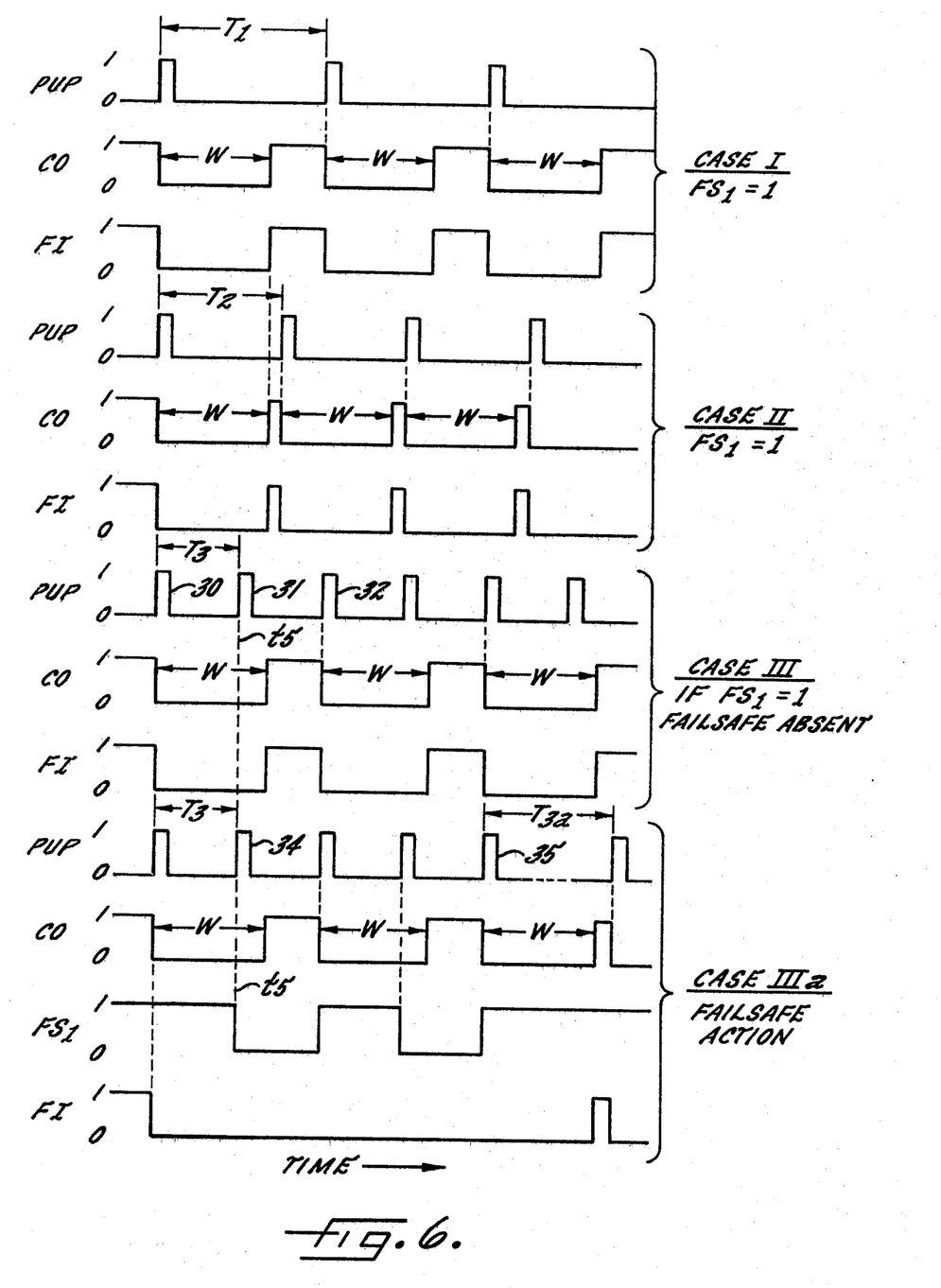
FIG. 6 is a series of waveforms, plotted against time, which illustrate variations in certain signals as they exist in the apparatus of FIG. 4 during operation.

Consider the Case I waveforms of FIG. 6 which illustrate normal operation of the transducer 100 with the constant intervals W constituting about one-third of the input signal period $T_1$. The duty cycle of the waveforms CO and FI is about 33% and the voltage $E_a$ would be about 3.3 volts for the exemplary assumptions stated above. Now, if the frequency of the input signals PUP increases to create a shorter period $T_2$ as shown for Case II in FIG. 6 the duty cycle of the waveforms CO and FI would decrease to about 10% and the output $E_a$ would properly fall to about 1.0 volts. In both Case I and Case II it is assumed that control signal FS supplied to AND gate 114 is continuously at a 1 level so that the filter input FI is the same in its waveform as the counter output CO.

The waveforms of Case III in FIG. 6 illustrate, however, the situation in which the frequency of the pulses PUP has increased to create a period $T_3$ which is less than the counting cycle intervals W. This might occur, for example, if a human operator inadvertently moved the throttle 10a (FIG. 1) beyond its intended maximum opening position so that the prime mover speed would increase beyond the maximum control range of the system. As shown in Case III of FIG. 6, a first input signal 30 initiates a counting cycle of duration W during which the waveform CO is at the 0 logic level. But before the interval W expires, a second input signal 31 appears at an instant labeled $t_5$ while the signal CO is at its logic 0 level and while the signal $\overline{CO}$ from inverter 108 (FIG. 2) is at its 1 level. With the signal $\overline{CO}$ at a 1 level and applied to the reset terminal R of flip-flop 106, the latter cannot switch to its set state, and thus any response to the second input signal 31 of FIG. 6 is precluded. Therefore, after the counting cycle initiated at 30 ends, the transducer system reverts to its "normal state" with the signal CO at a logic 1 level; it responds to the next succeeding input signal 32 as shown in FIG. 6 by resetting the counter to its zero count state. In these circumstances the counter output signal CO takes on a duty cycle which is roughly 33% because that signal cannot possess a duty cycle which is less than zero percent (as is approached in Case II). If the signal CO as it appears in FIG. 6 were transmitted through the AND gate 114 to create an identical waveform FI, the output $E_a$ would increase (in relation to Case II) and the governor system of FIG. 1 would therefore tend further to increase the speed of the prime mover 10. This would be an improper response which would aggravate and reinforce an excessive speed condition. Indeed, the governor system in these circumstances would attempt to further increase the speed of the prime mover until the action of the input signals PUP adjusted the duty cycle of the signal CO to make the signal $E_a$ match the set point signal $E_s$, and the system would spuriously stabilize at a speed which is twice that represented by the set point signal.

Figure 4:
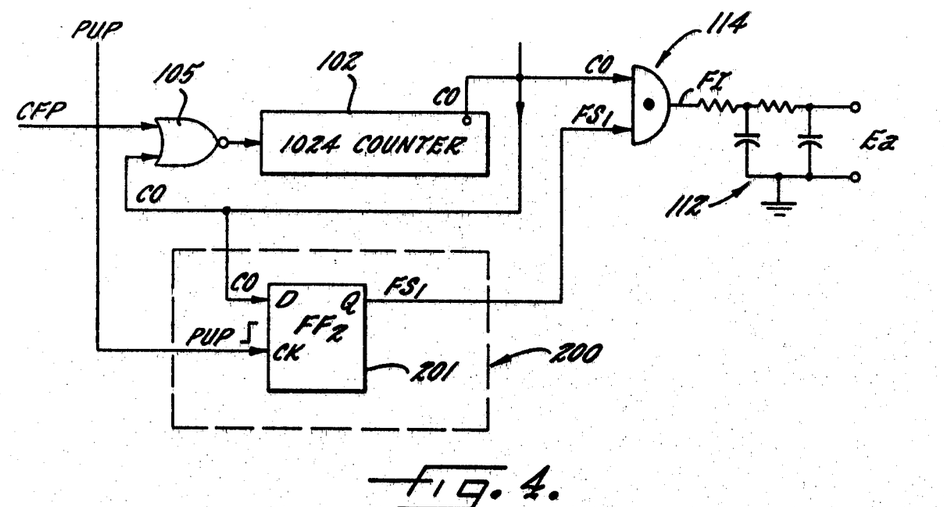
FIG. 4 is a fragmentary block diagram showing a simple version of the excessive speed failsafe apparatus which may be utilized in the transducer.

In keeping with the present invention, this problem is overcome by an excessive speed failsafe apparatus 200 (FIG. 1) associated with the transducer 100. Referring to FIG. 4, the excessive speed failsafe apparatus 200 is constituted by means responsive to an input signal arriving when the counter is counting for forcing the filter input signal FI to a predetermined one of its two levels (here the logic 0 level) so that the signal $E_a$ is forced to a low value which acts to close the throttle 10a (FIG. 1) and remove the excessive speed condition. Stated in other words, means are provided to detect the arrival of an input signal PUP at any instant when the counter 102 is counting, together with means responsive to such detection for holding the filter input signal FI (the output of AND gate 114) at a low level. While a variety of different logic apparatus may be employed for this purpose, the failsafe apparatus 200 shown in FIG. 4 is formed by a D-type flip-flop 201 which receives the input signals PUP on its clock terminal CK, and receives the counter output signal CO on its control terminal D. The Q output terminal of the flip-flop 201 thus produce a failsafe signal $FS_1$ which is routed to the AND gate 114 so that the latter normally transmits the signal CO to form the input signal FI. It will be apparent that the signal CO is at the 1 level when the counter is not executing a counting cycle, and the arrival of an input signal PUP at that time will set the flip-flop $FF_1$ so that the control signal $FS_1$ will normally reside at a 1 level to enable the AND gate 114. But if an input signal PUP should appear at the CK terminal of flip-flop 201 at an instant when the counter 102 is executing a counting cycle and the signal CO is at a logic 0 level (see the pulse 34 in FIG. 6), then the flip-flop 201 will be switched to its reset state and the signal $FS_1$ will revert to a 0 level, thereby disabling the AND gate 114.

The resulting operation is illustrated by the waveforms of Case IIIa in FIG. 6. When the input signal 34 arrives while the counter signal CO is at its 0 level, the flip-flop 201 is reset and the signal $FS_1$ changes from a 1 to a 0 level at the instant $t_5$. Accordingly, the AND gate 114 is disabled, and the signal FI must take on a 0 logic level (e.g., zero volts) so long as the flip-flop 201 is in its reset state. Therefore, the signal FI as illustrated in Case IIIa of FIG. 6 will remain at a 0 level (unlike the signal FI for Case III) so long as the input pulses PUP arrive with a spacing or period $T_3$ which is less than the constant intervals W. Despite the fact that the signal CO for Case IIIa has a duty cycle of approximately 30%, the signal FI remains at a low level and the signal $E_a$ will be held so low that the governor system of FIG. 1 will act to move the throttle 10a in a closing direction.

That corrective adjustment of the throttle will reduce the speed of the prime mover 10 and increase the period between the pickup pulses PUP. When, as illustrated in FIG. 6, the period increases to a duration $T_{3a}$ which equals or slightly exceeds the counting cycle duration W, then the flip-flop 201 will be switched to its set state upon the arrival of a pickup pulse labeled 35 and will thereafter remain in that state to make the signal $FS_1$ reside at a 1 level. The governor system will thereafter operate in a normal fashion and, if necessary, further reduce the prime mover speed to make it agree with the set point. Therefore, the failsafe circuit 200, shown in FIG. 4 as associated with the counter 102 and the AND gate 114, acts to correct and remove an excessive speed condition which would otherwise cause improper governor action if the prime mover speed were, for some reason, increased beyond a maximum safe value.

Still another difficulty may arise in the event that the speed-representing pickup pulses are totally lost. Consider the case where the conductor carrying the pulses from pickup 18 to the transducer 100 were suddenly broken so that no input signals arrived at the CK terminal of flip-flop 106 in FIG. 2. If this were to happen, the counter would simply remain permanently in its 1024 count state with the signal CO at a one level. And if the signal FS were then continuously at a one level, the signal FI would remain continuously at its highest one of two possible voltage levels, so that the signal $E_a$ would take on its maximum dc. voltage value. In these circumstances, the amplifier 20 of FIG. 1 would produce a very high throttle position command voltage, and the actuator 12 would move the throttle 10a in an opening direction to create a severe overspeed condition. Thus, loss of the speed-representing input signals PUP is a potential source of severe difficulty.

Figure 5:
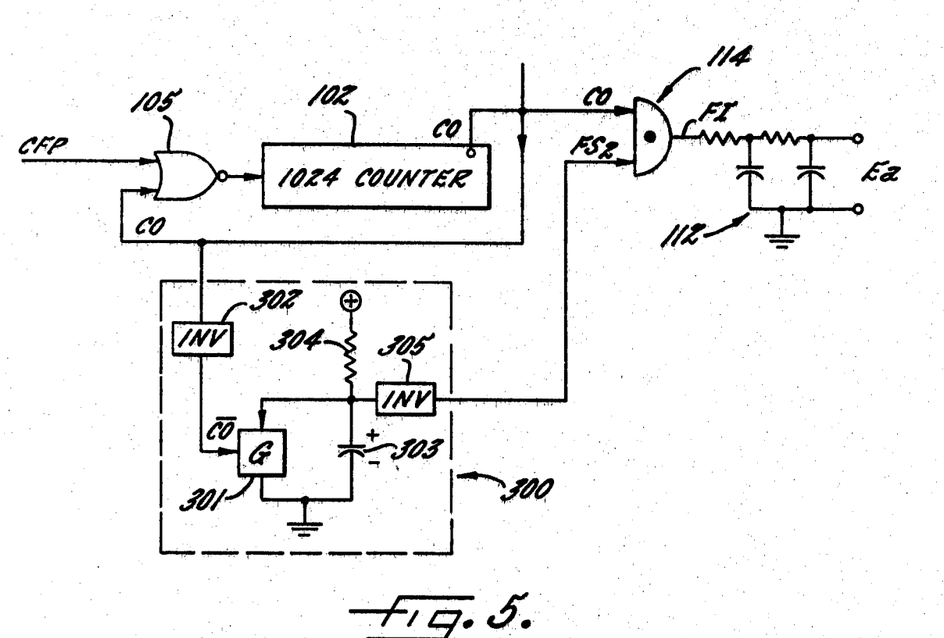
FIG. 5 is a fragmentary block diagram showing a simple version of a loss-of-signal failsafe apparatus which may be utilized in the transducer.

Although no claim is here made to signal loss failsafe apparatus per se, the transducer 100 (FIG. 1) may conveniently have associated with it relatively simple signal loss failsafe apparatus 300, a simplified version of which is illustrated in FIG. 5. Referring to the latter figure, the signal loss failsafe apparatus 300 is constituted by means for placing the output signal $E_a$ at its lowest speed-producing value in the event that the counter 102 fails at least periodically to execute a counting cycle. Since level transitions in the signal CO reflect the performance of counting cycles, this is accomplished by connecting the counter output signal CO through an inverter 302 to form as the controlling input $\overline{CO}$ to a gate 301 which is connected across a capacitor 303 so as to discharge the capacitor when the gate is enabled and conductive. The capacitor is charged with a selected time constant from a positive voltage source through a resistor 304 when the gate 301 is disabled. The voltage appearing across the capacitor is coupled through an inverter 305 as a control signal $FS_2$ to the AND circuit 114.

In operation, the capacitor 303 tends to charge between counting cycles by current flow through the resistor 304 to a relatively high or logic 1 voltage level. Each time that a counting cycle is executed, however, so that signal CO goes to a 0 level and signal $\overline{CO}$ goes to a 1 level, the gate 301 is enabled to quickly discharge the capacitor 303. If the counting cycles recur (i.e., if input signals PUP repeatedly are received and the counter is cleared in response to each) the capacitor 303 cannot charge sufficiently that its voltage rises to a logic 1 level. The signal $FS_2$ thus normally resides at a 1 logic level to keep the gate 114 normally enabled. When and if, however, the input signals fail to arrive periodically and trigger the counter into a counting cycle, so that the signal $\overline{CO}$ stays at the 0 level for some time, the capacitor 303 charges enough to make signal $FS_2$ fall to a 0 level. Thus, so long as the counter 102 executes counting cycles with a reasonable frequency (confirming that pickup signals are being received and responded to), the signal $FS_2$ remains at a logic 1 level and the gate 114 is enabled to transmit the counter signal CO so as to form the counterpart signal FI. In the event, however, that the counting cycles cease (due to loss of pickup signals PUP) then the capacitor charges sufficiently to make the signal $FS_2$ reside at a 0 logic level, thereby forcing the input signal FI to remain at a low level. If this happens, the governor system of FIG. 1 will reduce the excitation of the actuator 12 and move the throttle 10a toward a closed position.

The simplified versions of the excessive speed and signal loss failsafe devices 200 and 300 described with reference to FIGS. 4 and 5 may be both incorporated into cooperative association with the transducer 100 as illustrated by the preferred embodiment of FIG. 2. As there shown, the excess speed failsafe device is constituted by an inverter 210 coupled to receive the signal CO and producing the signal $\overline{CO}$. This signal $\overline{CO}$ is passed through a time delay circuit formed by a resistor 211 and a capacitor 212, the latter being shunted by a discharge resistance 213. The slightly delayed signal $\overline{CO}$ is applied to the D control terminal of the flip-flop 201 which receives the input signals PUP on its terminal CK as described previously with reference to FIG. 4. In the arrangement of FIG. 2, however, the $\overline{Q}$ output terminal of flip-flop 201 is connected as one input to a NAND gate 215, the output of which is coupled through a filter 216 to the base of a transistor 218. The signal appearing at the $\overline{Q}$ terminal of flip-flop 201 may be considered as a failsafe control signal $FS_1$ applied to the gate 215.

To create the loss of signal failsafe action, the signal $\overline{CO}$ from inverter 210 is supplied to control the gate 301 which periodically (and rapidly) discharges the capacitor 303 each time that the signal CO falls to its zero level during a counting cycle. On the other hand, if the signal $\overline{CO}$ does not periodically rise to a 1 level because the signal CO does not fall to a 0 level, then the capacitor charges to a logic 1 voltage level by current flow from a suitable voltage source through a resistor 304 which creates a relatively long time constant. If the voltage across capacitor 303 rises sufficiently (i.e., to a 1 level) to indicate that the counter 102 is not executing counting cycles, the output of the inverter 305 switches from its normal 1 level to a 0 level. The inverter output may be viewed as a second failsafe control signal $FS_2$.

From what has been said, it will be apparent that the output of NAND gate 215 normally resides at a 0 logic level when both the control signals $FS_1$ and $FS_2$ normally reside at 1 logic levels. In these circumstances, the base-emitter circuit of transistor 218 is non-conductive so current is not drawn from a positive voltage source through a load resistor 219 and the collector circuit of that transistor. Therefore, the voltage at the collector of transistor 218 normally resides at a high or logic 1 level because the transistor is cut off. This collector voltage is connected as a master failsafe control signal FS to the NAND gate 110 which forms a part of the overall AND circuit 114.

If the excessive speed condition described above should arise, then an input signal PUP will arrive at an instant when the counter 102 is counting (see again pulse 34 in FIG. 6) when the signal CO is at a 0 level and when the signal $\overline{CO}$ is at a one level. That input signal will therefore set the flip-flop 201, cause the signal at its $\overline{Q}$ terminal to switch from a 1 to a 0 level, and the resulting transition of control signal $FS_1$ to a 0 level will cause the output of NAND gate 215 to swing to a high or logic 1 level. In consequence the transistor 218 will be turned on, and the voltage drop across the resistor 219 will cause the signal FS to fall to a zero logic level. Thus, the AND circuit 114 will be disabled, and the signal FI held at a low level until such time as the excessive speed condition no longer exists.

On the other hand, if for any reason the pickup pulses fail to arrive or the counter 102 fails periodically to execute counting cycles, the signal CO will remain at a high level, the signal $\overline{CO}$ will remain at a low level, the gate 301 will remain disabled, and the capacitor 303 will not be periodically discharged. Therefore, the voltage across the capacitor will rise to a 1 level, and the inverter 304 will make the control signal $FS_2$ fall to a 0 level thereby switching the output of NAND gate 205 to a 1 level. This action renders the transistor 218 conductive and disables the AND gate 114 in the manner already described to hold the signal FI at a low level. In either situation, therefore, the apparatus of FIG. 2 "fails safe" and the governor amplifier 20 of FIG. 1 will cause the prime mover throttle to move in a closing and speed-reducing direction.

In the foregoing description, various references have been made to different signals residing at logic 1 (high) or logic 0 (low) levels under different circumstances. It is to be understood that this has been done merely by way of example to impart concreteness to the description. Those skilled in the art will comprehend readily that many signal inversions may be introduced without departing from the essential teachings herein given; so long as the signal inversions are of an even number, the resulting operation will be the same and the resulting apparatus fully equivalent.

I claim:

1. In a transducer for converting the variable frequency of recurring input signals into a correspondingly varying dc. output, the combination comprising
   (a) an oscillator producing rapidly repeating signals at a constant, predetermined frequency substantially greater than the maximum frequency of said input signals,
   (b) a digital counter having an output terminal on which appears a counter output voltage at a first or second level when the counter respectively is in or is not or above a predetermined count state, one of said levels being relatively high and the other relatively low,
   (c) gate means interposed between said oscillator and the counting input of said counter,
   (d) means responsive to said voltage on said counter output terminal for controlling said gate means to be disabled or enabled when the counter is or is not in said predetermined count state,
   (e) means responsive to each of said input signals for resetting said counter to a preselected count state lower than said predetermined count state, and
   (f) means for filtering said counter output voltage to create a final dc. output which varies as the average of such voltage and inversely in proportion to the frequency of said input signals.

2. The combination set forth in claim 1 wherein said means (e) includes
   (e1) a bi-state device capable of residing in set and reset states,
   (e2) means responsive to each of said input signals for setting said device,
   (e3) means responsive to setting of said device for resetting said counter to said preselected count state, and
   (e4) means responsive to said counter voltage switching from said first to said second level for resetting said device.

3. The combination set forth in claim 1 wherein said preselected count state is the zero count state.

4. The combination set forth in claim 1 further including
   (g) means responsive to an input signal occurring while said counter voltage is at said second level for supplying to said filtering means a voltage having said second level even when the counter output voltage next takes on said first level, whereby the input to said filter cannot falsely indicate that the frequency of input signals is lower than it actually is.

5. In a transducer for converting the variable frequency of recurring input signals into a correspondingly variable dc. output, the combination comprising
   (a) an oscillator producing a continuing pulse stream at a constant, predetermined frequency substantially greater than the maximum frequency of said input signals,
   (b) a digital counter having an output terminal on which appears a high or low counter output voltage level when the counter is or is not in or above a predetermined count state,
   (c) a gate interposed between said oscillator and the counting input of said counter, and disabled or enabled when a high or low control voltage is applied thereto to block or pass said pulse stream,
   (d) means for coupling said voltage from said output terminal as a control to said gate,
   (e) a bi-state flip-flop capable of being set or reset,
   (f) means responsive to each of said input signals for setting said flip-flop,
   (g) means responsive to setting of the flip-flop for clearing the counter to zero count state,
   (h) means responsive to said counter voltage switching from a high to a low level for resetting said flip-flop, and
   (i) means for filtering said counter output voltage to produce a final dc. output, whereby each input signal causes said counter to count pulses from said stream from zero to said predetermined count state to measure off a constant time interval during which said counter output voltage is at a low value, so that the duty cycle of said dc. voltage varies inversely with changes in the frequency of said input signals.

6. In a system for governing the speed of a prime mover by adjusting a throttle member to maintain the speed in agreement with a set point signal, including
   (a) means for sensing the speed of the prime mover to produce input signals which in frequency are proportional to and indicative of actual speed,
   (b) a source of constant frequency signals having a frequency substantially higher than the maximum frequency of said input signals,
   (c) a digital counter,
   (d) means responsive to each input signal received when the counter is not counting for initiating a counting cycle during which said counter counts said constant frequency signals from a preselected count state to a predetermined count state,
   (e) means including said counter for producing a dc. voltage which is at a first or second level when the counter is not or is counting,
   (f) means for filtering said counter output voltage to produce a final dc. output signal which varies inversely in proportion to changes in actual speed, and
   (g) means for subtractively combining said set point and dc. output signals to open said throttle when said output signal increases and closes said throttle when said output signal decreases, the improvement characterized by
      (1) means for detecting the arrival of an input signal when said counter is counting, and
      (2) means responsive to such detection for holding said dc. voltage at said second level until an input signal arrives when the counter is not counting, whereby overspeeding of said prime mover to the point that the period of said input pulses is less than the duration of each counting cycle does not result in further opening of the throttle.

7. In a transducer for converting the variable frequency of recurring input signals into a correspondingly varying dc. output, the combination including
   (a) a source of constant frequency signals having a frequency substantially higher than the maximum frequency of said input signals,
   (b) a digital counter,
   (c) means for causing said counter to count said constant frequency signals from a preselected count state (e.g., zero) to a predetermined count state (e.g., 1024) in response to each of said input signals occurring when the counter is not counting,
   (d) means including said counter for producing a dc. voltage which is at a first level when the counter is counting and at a second level when the counter is not counting, whereby the duty cycle of said voltage varies inversely as the frequency of the input signals changes, and characterized by the improvement of
      (1) means for detecting the arrival of an input signal while said counter is counting, and
      (2) means responsive to such detection for holding said dc. voltage at said second level until an input signal arrives when the counter is not counting.

8. The combination set forth in claim 7 wherein said means (1) comprises
   (1a) means for obtaining from said counter a counter output voltage which is at a first level (e.g., 1) when the counter is in or above said predetermined count state and which is at a second level (e.g., 0) when the counter is in a state lower than said predetermined count state, and
   (1b) means for producing a control signal (FS) which switches from a first level (e.g., 1) to a second level (e.g., 0) to match the then-existing level of said counter output voltage at the instant an input signal arrives, whereby said control signal when at said second level indicates that an input signal has arrived while said counter is counting.

9. The combination set forth in claim 7 wherein said means (2) is a logic gate controlled by said means (1) and receiving as a second input an output voltage from said counter, said dc. voltage appearing at the output of said gate.

10. In a transducer for converting the variable frequency of recurring input signals into a correspondingly variable dc. output, the combination comprising
   (a) an oscillator producing a continuing pulse stream at a constant, predetermined frequency substantially greater than the maximum frequency of said input signals,
   (b) a digital counter having an output terminal on which appears a high or low counter output voltage level when the counter is or is not in or above a predetermined count state, (c) a gate interposed between said oscillator and the counting input of said counter, and disabled or enabled when a high or low control voltage is applied thereto to block or pass said pulse stream, (d) means for coupling said dc. voltage from said output terminal as a control to said gate, (e) a bi-state flip-flop capable of being set or reset, (f) means responsive to each of said input signals for setting said flip-flop, (g) means responsive to setting of the flip-flop for clearig the counter to zero count state, (h) means responsive to said counter voltage switching from a high to a low level for resetting said flip-flop, (i) a second bi-state flip-flop capable of being set or reset, (j) means responsive to the arrival of an input signal at an instant when said counter voltage is low or high for respectively setting or resetting said second flip-flop, and (k) a second gate receiving as one input the counter voltage from said counter and enabled by a control signal from said second flip-flop when the latter is reset, and (l) means for filtering the output of said second gate to produce a final dc. voltage which varies inversely according to changes in the frequency of said input signals.

* * * * *

UNITED STATES PATENT OFFICE
CERTIFICATE OF CORRECTION

PATENT NO. : 4,085,373
DATED : April 18, 1978
INVENTOR(S) : Robert G. McConnell

It is certified that error appears in the above-identified patent and that said Letters Patent are hereby corrected as shown below:

Column 3, line 29, "18b" (second occurrence) is changed to --18a--.

Column 4, line 42, "$\mp$" is changed to -- $\oplus$ --.

Column 12, lines 40 and 41, "is in or is not or" is changed to

--is or is not in or--

Column 15, line 13, "clearig" is changed to --clearing--.

Signed and Sealed this

Tenth Day of October 1978

[SEAL]

Attest:

RUTH C. MASON
Attesting Officer

DONALD W. BANNER
Commissioner of Patents and Trademarks